United States Patent
Lipman et al.

(10) Patent No.: US 6,911,620 B2
(45) Date of Patent: Jun. 28, 2005

(54) SYSTEM AND METHOD FOR UNVEILING TARGETS EMBEDDED IN A MULTI-LAYERED ELECTRICAL CIRCUIT

(75) Inventors: Eliezer Lipman, Rishon Lezion (IL); Zvi Kotler, Tel Aviv (IL); Yehiam Prior, Rehovot (IL)

(73) Assignee: Orbotech, Ltd., Yavne (IL)

( * ) Notice: Subject to any disclaimer, the term of this patent is extended or adjusted under 35 U.S.C. 154(b) by 39 days.

(21) Appl. No.: 10/214,755

(22) Filed: Aug. 9, 2002

(65) Prior Publication Data

US 2003/0052099 A1 Mar. 20, 2003

Related U.S. Application Data (60) Provisional application No. 60/310,842, filed on Aug. 9, 2001.

(51) Int. Cl.[7] .............................................. B23K 26/36
(52) U.S. Cl. ........................... 219/121.68; 219/121.83; 219/121.69
(58) Field of Search ....................... 219/121.67, 121.68, 219/121.69, 121.7, 121.71, 121.72, 121.83; 174/255; 29/830, 846, 847, 852; 250/559.4, 559.44, 559.45; 356/237.2, 237.4, 237.5; 382/147

(56) References Cited

U.S. PATENT DOCUMENTS

| | | | |
|---|---|---|---|
| 4,549,206 A | * 10/1985 | Suzuki et al. ............... 348/126 |
| 5,063,280 A | 11/1991 | Inagawa et al. | |
| 5,246,316 A | * 9/1993 | Smith .......................... 408/1 R |
| 5,377,404 A | * 1/1995 | Berg ............................ 29/830 |
| 5,386,430 A | * 1/1995 | Yamagishi et al. ........... 372/57 |
| 5,593,606 A | 1/1997 | Owen et al. | |
| 5,690,846 A | * 11/1997 | Okada et al. ........... 219/121.78 |
| 5,736,279 A | 4/1998 | Mott et al. .................... 430/22 |
| 6,046,429 A | 4/2000 | Datta .................... 219/121.69 |
| 6,556,293 B2 | * 4/2003 | Savareigo ................ 356/237.5 |
| 6,609,297 B1 | * 8/2003 | Hiramatsu et al. ............ 29/852 |
| 2002/0055789 A1 | 5/2002 | Ben-Ezra et al. | |

FOREIGN PATENT DOCUMENTS

| | | |
|---|---|---|
| WO | WO 00/19793 | 4/2000 |
| WO | WO 02/39794 | 5/2002 |

* cited by examiner

*Primary Examiner*—Jonathan Johnson
(74) *Attorney, Agent, or Firm*—Sughrue Mion, PLLC (57) ABSTRACT

A system for unveiling embedded targets in printed circuit board substrates includes a micro-machining device, a sensor, and a controller. The micro-machining device removes portions of an opaque layer overlaying an alignment target in a general region in which the target should be located, and the sensor senses whether the alignment target is located at selected locations where portions of the opaque layer have been removed. In response to sensing the presence or absence of an alignment target at the selected locations, the controller directs the micro-machining device to remove additional portions of the opaque layer.

9 Claims, 5 Drawing Sheets

SYSTEM AND METHOD FOR UNVEILING TARGETS EMBEDDED IN A MULTI-LAYERED ELECTRICAL CIRCUIT

CROSS-REFERENCE TO RELATED APPLICATIONS

This application claims the benefit of U.S. Provisional Application No. 60/310,842, filed Aug. 9, 2001, which is incorporated by reference, herein, in its entirety.

FIELD OF THE INVENTION

The present invention relates to systems and methods for unveiling fiducial targets employed in the manufacture of electrical circuits.

BACKGROUND OF THE INVENTION

The manufacture of electrical circuits typically includes the depositing of a pattern of conductive lines and pads on a dielectric substrate. Several separate layers may be laminated together to form an electrical circuit board. Alternatively, an electrical circuit board may be produced by forming subsequent layers in a build-up type process. Typically, one or more substrate layers is provided with an alignment target that is employed as a reference in order to place respective substrate layers in mutual registration or to align via holes, which are drilled in the substrate, to patterns formed on the substrate layers. Alignment targets typically are embedded between various substrate layers. In order to employ a target in an alignment process, it is necessary to ascertain the location of the target.

SUMMARY OF THE INVENTION

The present invention seeks to provide improved methods for unveiling targets embedded in printed circuit board substrates.

In accordance with a general aspect of the invention a system for unveiling embedded targets in printed circuit board substrates includes a micro-machining device, such as a laser driller, and a sensor, such as an optical or acoustic sensor, and a controller. The micro-machining device removes portions of an opaque layer overlaying an alignment target in a general region in which the target should be located, and the sensor senses whether the alignment target is located at selected locations where portions of the opaque layer have been removed. In response to sensing the presence or absence of an alignment target at the selected locations, the controller directs the micro-machining device to remove additional portions of the opaque layer.

In accordance with another general aspect of the invention, a method is provided to unveil an alignment target embedded in a printed circuit board. The presence or absence of the alignment target at selected locations is sensed and then, in response to the sensing, portions of the printed circuit board overlaying the alignment target are removed. In an embodiment of the invention, relatively small non-contiguous portions of the printed circuit board, generally in the vicinity of an alignment target to be unveiled and sufficient to enable sensing of the presence or absence of the target at selected locations, are removed. The sensing, for example optical sensing, is performed at the selected locations in the removed portions. Subsequently, in response to the sensing, relatively large portions of the printed circuit board are removed in order to fully unveil the target. Alternatively, the sensing may, without first opening portions of the printed circuit board, be performed using, for example, an acoustic or x-ray sensor.

In accordance with still another general aspect of the invention, a method is provided for producing printed circuit boards. A pattern of conductors, including at least one alignment target, is deposited on a printed circuit board substrate, and is subsequently covered by a generally opaque layer of material, for example a copper laminate. Selected portions of the opaque layer are removed in a general region surrounding where the alignment target is expected to be located, and a sensor senses whether the alignment target is located at selected removed portions. In response to sensing the presence or absence of an alignment target at a removed portion, additional portions of the opaque layer are removed to unveil the alignment target. The alignment target is then employed in the alignment of subsequent portions of an electrical circuit to be formed on the printed circuit board substrate.

There is thus provided in accordance with an embodiment of the invention a system for unveiling an alignment pattern located in a multi-layered printed circuit board substrate including a micro-machining device removing a part of said multi-layered printed circuit board substrate at selected locations thereof; a sensor sensing whether an alignment pattern is present at selected locations; and a controller receiving an output of the sensor for at least at some of the selected locations and, in response to the output of sensor, selecting additional locations for the micro-machining device to selectively remove a part of said multi-layered printed circuit board.

Various embodiments of the invention include one or more of the following features and functionalities.

The micro-machining device includes a laser micro-machining device, which optionally is a laser driller.

The part of the multi-layered printed circuit board substrate which is removed is part of a single layer in a multi-layered printed circuit board. Optionally it is a part of two layers or more in a multi-layered printed circuit board.

The sensor is an optical sensor, which optionally is a photodiode, a CCD sensor or other suitable sensor.

Alternatively the sensor is an acoustic sensor or an X-ray sensor.

The controller is operative to select locations for the micro-machining device to selectively remove a part of the multi-layered printed circuit board in a first pattern, and, in response to a sensor supplying an output corresponding to an alignment pattern being present at a location, the controller selects additional locations for said micro-machining device to selectively remove a part of said multi-layered printed circuit board in a second pattern.

The first pattern is a pattern of non-contiguous openings distributed in a first region of a layer of the multi-layered printed circuit board substrate. Alternatively, a plurality of generally contiguous openings is formed until a desired portion of an alignment target is uncovered.

The second pattern forms an unveiling opening which is larger than ones of the non-contiguous openings but smaller than the first region.

There is thus provided in accordance with another embodiment of the invention a method for unveiling an alignment target located inside a multi-layered laminate, including forming a plurality of first openings in the multi-layered laminate in a first pattern at a general region in which an alignment target is expected to be located; sensing at least at some of the first openings whether said alignment target is located thereat; and in response to sensing that said alignment target is located at a first opening, forming a second opening to unveil said target.

Embodiments of the method include one or more of the following features and functionalities: the spatial extent of the second opening is smaller than said general region, and the spatial extent of the second opening is larger than individual first openings.

There is thus provided in accordance with still another embodiment of the invention a method for manufacturing printed circuit boards including depositing a first part of an electrical circuit pattern on a first substrate layer, wherein the pattern includes an alignment target; adhering the first substrate layer to a second substrate layer to form a printed circuit board laminate in which the alignment target is embedded between said first substrate layer and said second substrate layer; forming a plurality of first openings in the laminate at a general region in which said target is expected to be located; sensing at least some of the plurality of first openings whether said target is located thereat; and in response to sensing that said target is located at a first opening, forming a second opening to unveil said target.

Embodiments of the method for manufacturing a printed circuit board include one or more of the following features: the spatial extent of the second opening is smaller than the general region, and the spatial extent of the second opening is larger than individual ones of the first openings.

BRIEF DESCRIPTION OF THE DRAWINGS

The present invention will be understood and appreciated more fully from the following detailed description, taken in conjunction with the drawings in which.

DETAILED DESCRIPTION

Figure 1:
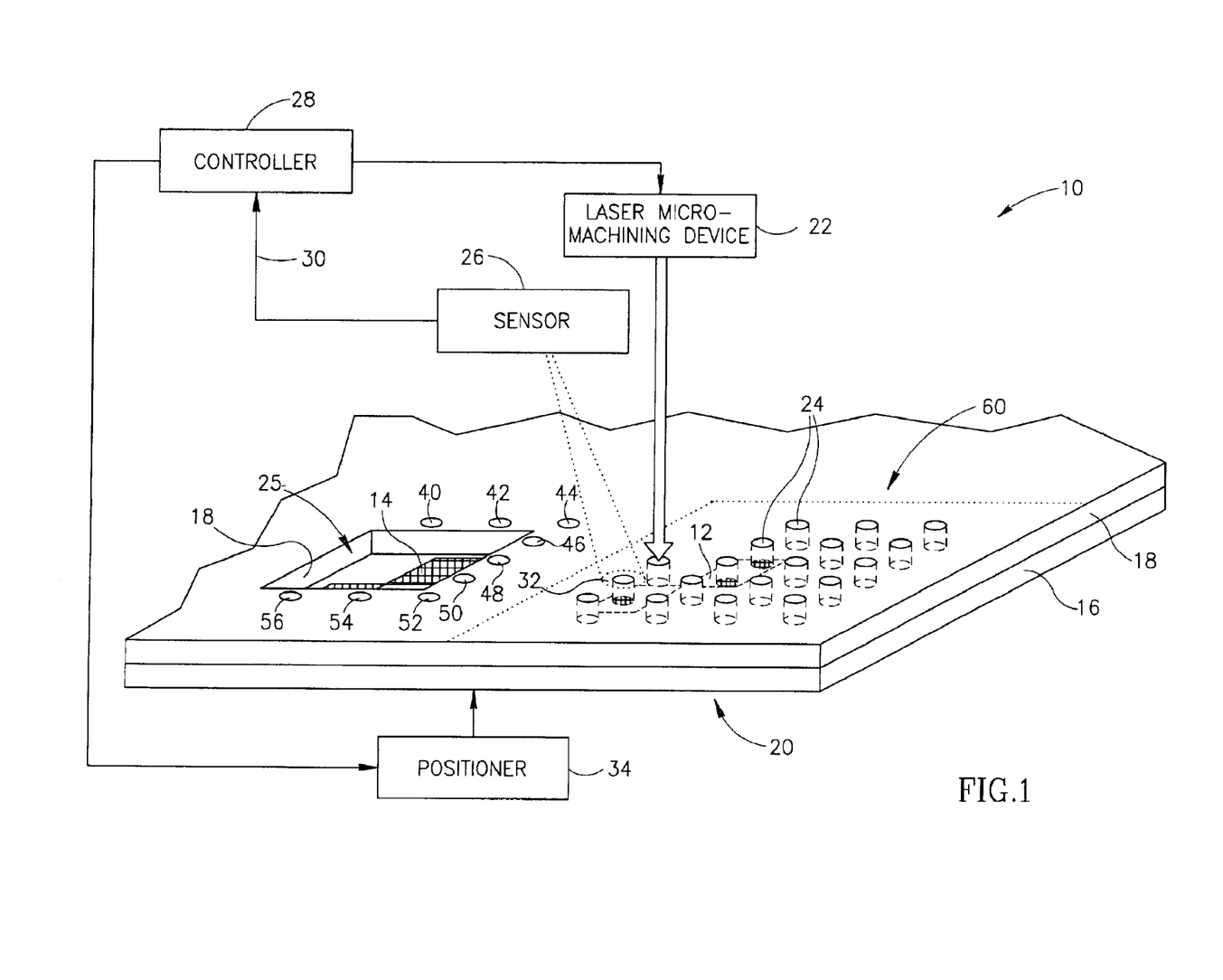
FIG. 1 is a simplified part block diagram, part pictorial illustration of a system for unveiling alignment targets in accordance with the present invention.

Reference is made to FIG. 1, which is a simplified part block diagram, part pictorial illustration of a system 10 for unveiling alignment targets in accordance with the present invention. Two alignment targets, indicated by reference numerals 12 and 14, respectively, are seen in FIG. 1. Alignment target 12 is embedded between a lower layer 16 and an upper layer 18 of a laminated substrate 20, such as a printed circuit board. Alignment target 14 has been unveiled by removing a portion of upper layer 18. Upper layer 18 of substrate 20 is generally opaque such that alignment targets, such as targets 12 and 14, generally are not visible to the naked eye, except where portions of upper layer 18 are removed.

In an embodiment of the invention as seen in FIG. 1, system 10 includes a micro-machining device 22 which is operative to selectively remove portions 24 of upper layer 18 at a multiplicity of selected locations disposed along upper layer 18, and a sensor 26 sensing whether an alignment pattern, such as pattern 12, is present or absent at selected ones of the locations at which portions 24 have been removed. A micro-machining device suitable for removing portions 24 is described in Applicant's copending U.S. patent application Ser. No. 10/167,472 for a "Multiple Beam Micro-Machining System", filed Jun. 13, 2002, the disclosure of which is incorporated by reference in its entirety. As seen in FIG. 1, portions 24 may be removed in a non-contiguous pattern. The presence of an embedded pattern, such as pattern 12, may be sensed via portions 24. Alternatively portions 24 may be removed in a generally continuous manner, with sensor 26 sensing when an alignment pattern, such as pattern 12, is partially uncovered.

System 10 further includes a controller 28 that receives an output 30 of sensor 26 for at least at some locations of removed portions 24, such as at a sensed portion 32 which is shown as being sensed by sensor 26. In some stages of operation, controller 28, which is in operative communication with laser micro-machining device 22 and a positioner 34, suitably positions substrate 20 for removal of portions 24 and directs one or more laser beams output by laser micro-machining device 22 to impinge on upper layer 18 at selectable locations according to a pattern. In subsequent stages of operation, controller 28 selects at least some additional locations for micro-machining device 22 to selectively remove additional portions of upper layer 18 of substrate 20. The additional locations are selected at least partly in response to output 30 indicating the location of an embedded alignment pattern.

The result of removing of additional portions of upper layer 18 is seen with reference to target 14. Thus in the vicinity of target 14, several portions, constituting pilot holes and indicated by reference numerals 40–56 respectively, have been removed. Upon sensing by sensor 26, target 14 was not found to be present at any of pilot holes 40–56. However at least at some additional pilot holes overlaying target 14; no longer seen in substrate 20, sensor 26 sensed the presence of target 14 and provided suitable instructions were provided by controller 28 to laser micro-machining device 22 and to positioner 34 to form opening 25 which unveils target 14.

It is appreciated that in accordance with an embodiment of the invention, micro-machining device 22 may be any suitable micro-machining device, and typically employs a laser operative to selectively remove portions of surface 18. Suitable micro-machining devices for use in unveiling alignment targets, and subsequently for use in forming vias in electrical circuit substrates are commercially available from Electro Scientific Industries, Inc. of Portland, Oreg. Other suitable micro-machining devices are described in Applicant's copending U.S. patent application Ser. No. 10/167, 472 for a "Multiple Beam Micro-Machining System", filed Jun. 13, 2002.

Although layer 18 is seen in FIG. 1 as being a single uniform layer, it is appreciated that layer 18 may, and typically does, comprise one or more sub-layers, for example a fiberglass—epoxy substrate overlaid with a film of copper and optionally an exposed or non-exposed photoresist. Thus, as used herein, reference to removal of a portion refers to removal of a portion of any layer or layers that overlay a target 12 to be unveiled.

Sensor 26 may be any sensor suitable to detect the presence of an alignment target, such as targets 12 or 14. Suitable sensors include optical sensors, such as photodiodes, CCD sensors or CMOS sensors, sensing the presence or absence of a target 12 at the base of a sensed portion 32, for example by measuring an intensity of light reflected from the bottom of a sensed portion. Alternatively, sensors operative to sense the presence or absence of a target at the bottom of a sensed portion 32 include acoustic sensors operating at sonic or ultrasonic frequencies. Still alternatively, sensor 26 may be an X-ray sensor operative to provide an indication of the location of a target 12, without necessitating first removing portions 24.

Figure 2:
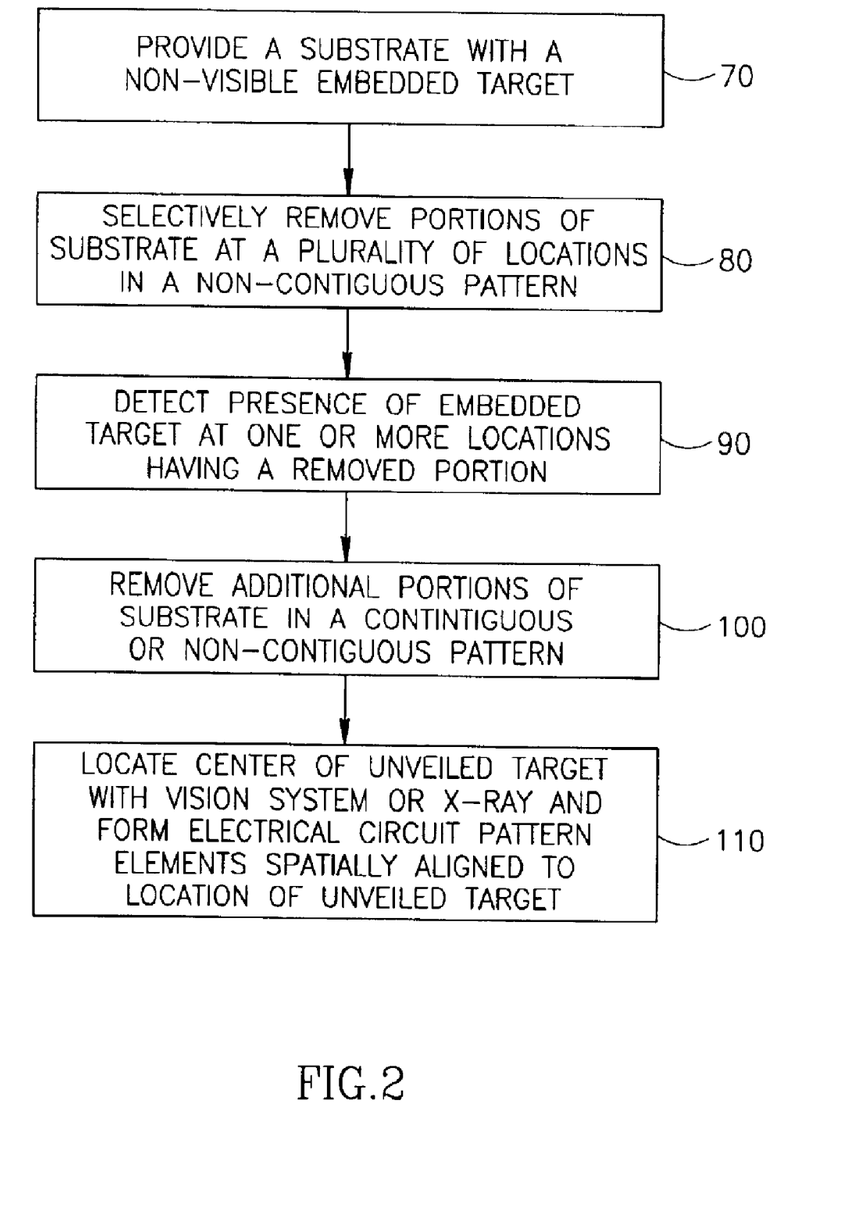
FIG. 2 is a simplified flow diagram illustrating a method for unveiling alignment targets employing the system of FIG. 1.
Figure 3:
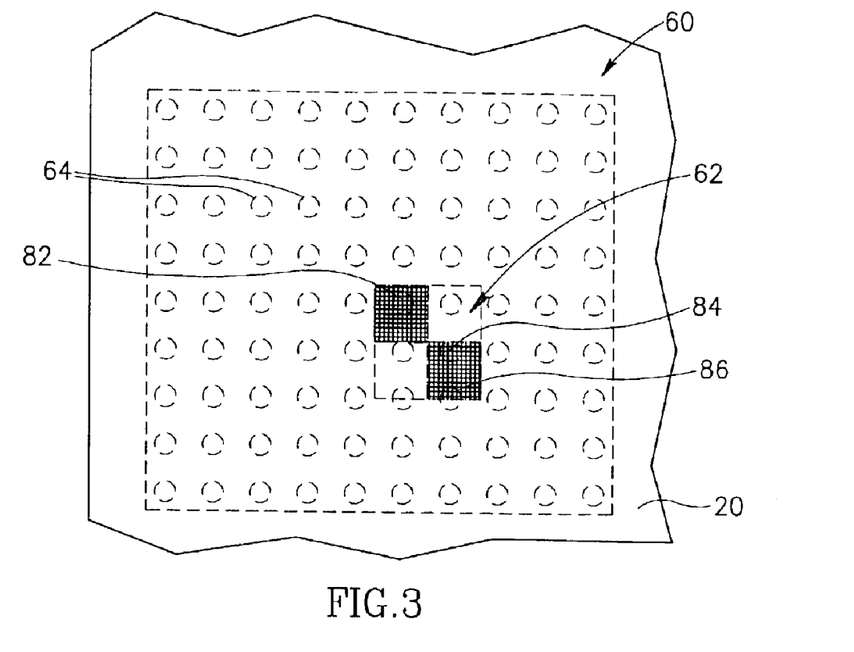
FIG. 3 is a top view of a substrate showing the location of a hidden alignment target therein.
Figure 4:
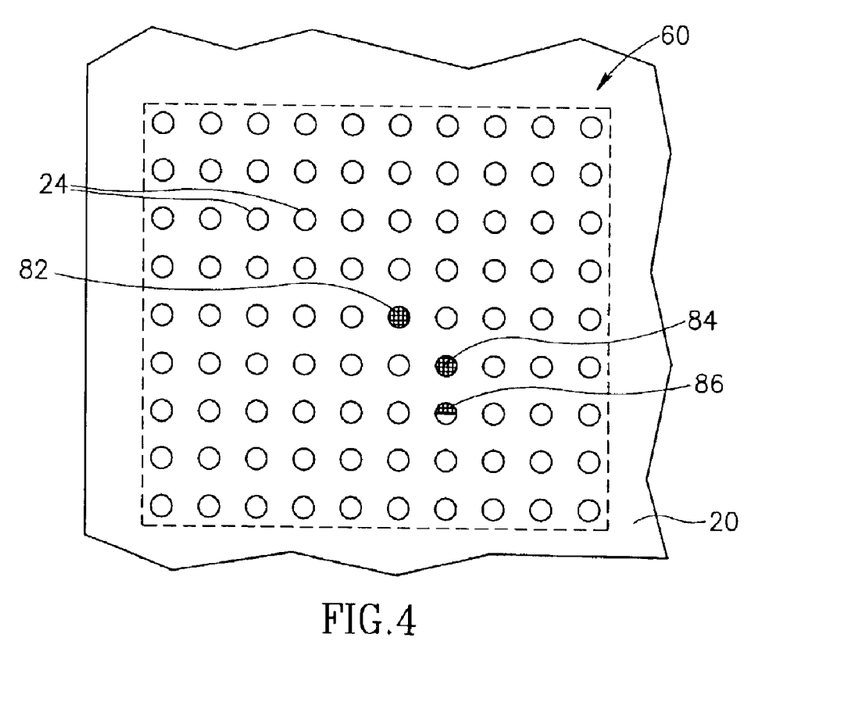
FIG. 4 is a top view of a substrate illustrating portions of a hidden target seen after removal of portions in accordance with the invention.

Reference is now made to FIG. 2 which is flow diagram of a method for unveiling an alignment target in accordance with an embodiment of the invention, to FIG. 3 which is a top view of a region 60 on a substrate 20 showing the relationship between an alignment target 62 to be unveiled, corresponding to target 12 in FIG. 1, and portions 24 to be removed from substrate 20, and to FIG. 4 which is a top view of region 60 following removal of portions 24 therefrom.

Turning to FIG. 3, a region on a substrate in which the alignment target 62 may be located is shown prior to operation of system 10 (FIG. 1) to unveil target 62. Each of portion locations 64 is shown in phantom outline indicating a possible location at which a portion 24 (FIG. 1) may be removed by system 10. It is noted that each of portion locations 64 is discrete and that together all of portion locations 64 form pattern of non-contiguous pattern parts. Likewise, in FIG. 3 target 62 is shown in phantom outline to indicate that it is embedded beneath the surface of substrate 20 and is not readily visible prior to operation of system 10 to remove portions 24 or to form an opening 25 in top surface 18 (FIG. 1).

In accordance with an embodiment of the invention a substrate having an alignment target embedded therein so as to be not visible through an outer layer of thereof is provided to system 10 (FIG. 1) for unveiling of the alignment target (operation 70). Portions of the substrate, typically portions 24 of upper surface 18, are selectively removed at a plurality of locations in order to form a non-contiguous pattern of pilot holes (operation 80).

As seen in FIG. 4, after the removal of portions 24 to form pilot holes, portions of target 62 are visible at several locations, indicated by reference numerals 82, 84 and 86. Each of locations 82–86 overlay target 62, and the presence of target 62 can be sensed at each of portions 82, 84 and 86, for example using an optical sensor. Following the removal of portions 24, the presence, or absence, of an embedded target 62 is sensed at one or more of locations 24 having a removed portion (operation 90).

In response to sensing the presence, or absence, of target 62 at a location 24 (i.e., in response to a sensing determination), additional portions of substrate 20 are removed in order to provide an opening 25 (FIG. 1) that unveils target 62 (operation 100). The additional portions may be removed by system 10 in any suitable contiguous or non-contiguous pattern. Because the spatial extent of target 62 is substantially smaller than region 60 in which it may be generally located, opening 25 needs only to be large enough to unveil target 62, and typically is substantially smaller than region 60.

After one or more alignment targets, such as target 14 in FIG. 1, are unveiled, their location is detected by a position detection sensor (not shown), such as a CCD sensor or X-ray. Part of an electrical circuit pattern (not shown) is formed in or on substrate 20 in spatial alignment to the unveiled target 14 (operation 110). The parts of an electrical circuit may be, for example, vias drilled into substrate 20 or a conductor pattern formed by suitably exposing a photo-resist deposited on the surface of substrate 20. Examples of systems suitable for detecting the location of an alignment target and exposing an electrical circuit pattern in spatial alignment thereto are described in the following patent applications, the disclosures of which are incorporated by reference: U.S. Ser. No. 09/708,160 to Kantor et. al., U.S. Ser. No. 09/792,498 to Ben-Ezra et. al., and IL 142354 to Orbotech Ltd.

Figure 5:
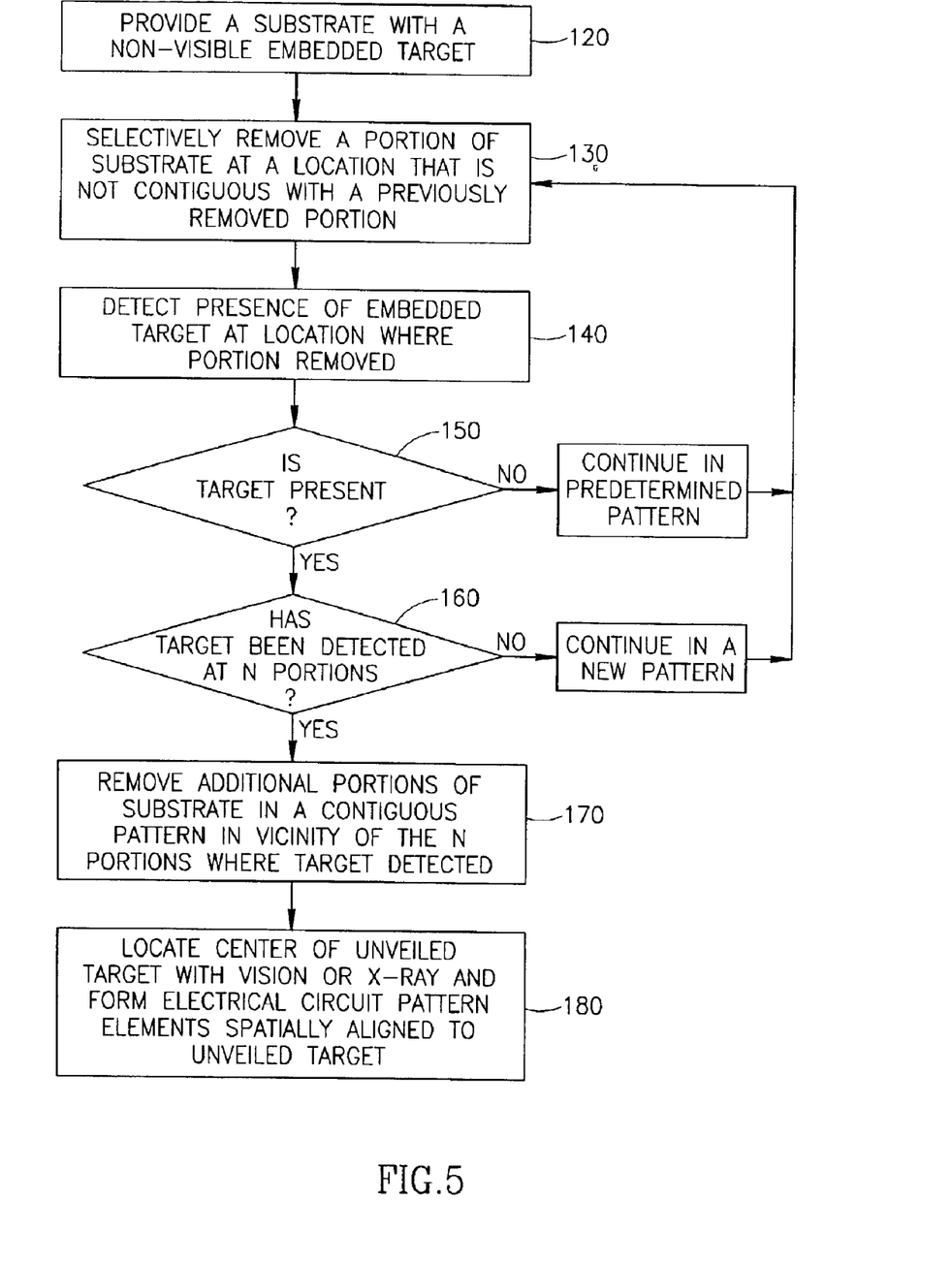
FIG. 5 is a simplified flow diagram illustrating an optimized method for unveiling alignment targets in a substrate.
Figure 6:
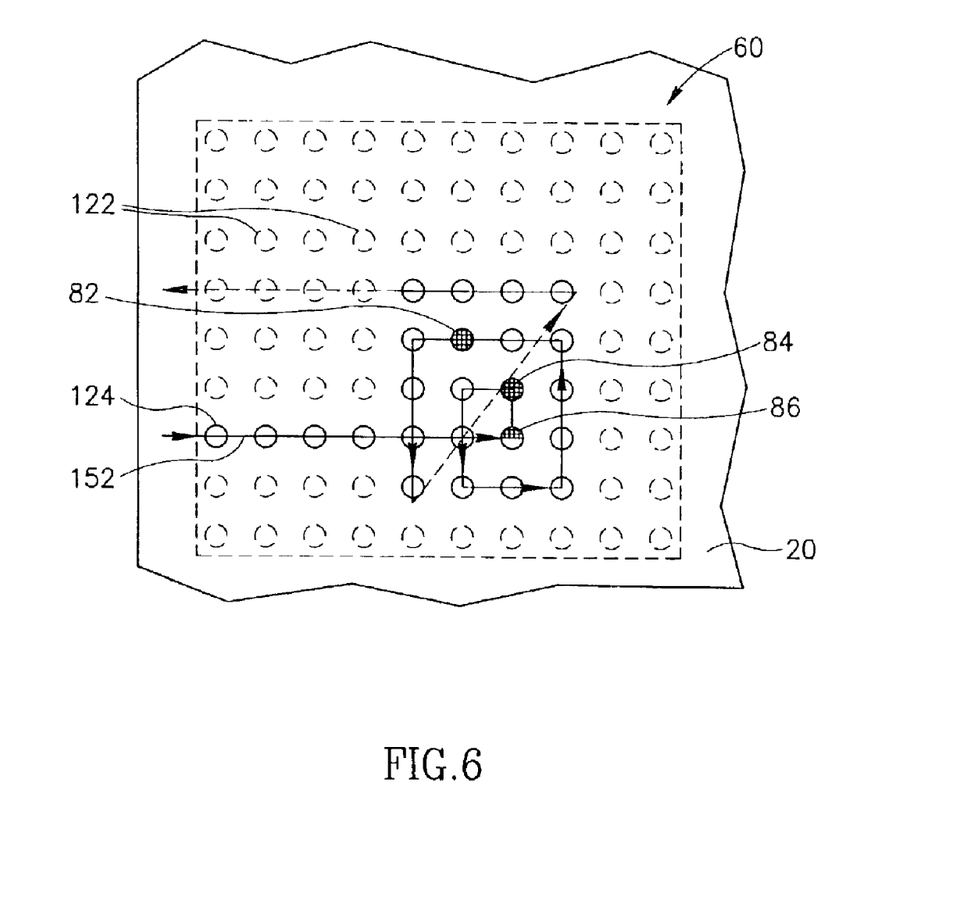
FIG. 6 is a top view of a substrate illustrating the optimized method for unveiling an alignment target seen in FIG. 5.

Reference is now made to FIG. 5 which is flow diagram of another, more optimized, method for unveiling an alignment target in accordance with an embodiment of the invention, and to FIG. 6 which is a top view of a region 60 on a substrate 20 illustrating the method seen in FIG. 5. In FIG. 6, region 60 is shown following operation of system 10. Portions 24 which have actually been removed are shown in solid lines. Candidate locations 122, shown in broken lines, are locations at which portions 24 may be, but have not been, removed.

It is appreciated that the method seen in FIG. 5 differs from the method seen in FIG. 2 in that in the method of FIG. 5 sensor 26 (FIG. 1) is employed interactively with laser micro-machining device 22 in determining the location of an alignment target, thereby further reducing the quantity of portions 24 that need to be removed prior to forming opening 25 and thus further increasing the efficiency of system 10.

In accordance with the method seen in FIG. 5, a substrate 20 having a non-visible alignment target embedded therein is provided to system 10 (FIG. 1) for unveiling an alignment target (operation 120). A first portion 124 of substrate 20 is selectively removed from upper surface 18 by a laser micro-machining device (operation 130). It is appreciated that first portion 124 is, by definition, non-contiguous with any other portions 124.

Target 62 (FIG. 3) may be located anywhere inside region 60. Thus following removal of first portion 124, sensor 26 senses the presence or absence of a target 62 (operation 140). If the presence of target 62 is not detected (operation 150), then system 10 loops to step 130 and continues to selectively remove portions 24 according to predetermined pattern of locations, for example by removal of non-contiguous portions 24 along line 152. This iterative process continues until a portion of target 62, for example portion 86, is detected.

Thus upon detection of a target portion, for example portion 86, logic circuitry (not shown) ascertains whether a sufficient number N of target portions 82–86 have been detected to satisfactorily determine a more precise location of target 62 (operation 160) within region 60. Typically at least two or three target portions 82–86 need to be sensed in order to determine the location of target 62. If the number of target portions 82–86 located is less than the number required to determine the location of target 62, then the skiving process loops back to operation 130, however the removal of portions 24 continues according to a new pattern of locations. For example, as illustrated in FIG. 6, portions 24 are removed in a generally spiral pattern such that upon detection of a portion overlaying target 62, the direction of arrow 152 for removal of portions 124 is changed.

The removal of portions 124 continues until a sufficient number N of target portions are unveiled and sensed. As seen in FIG. 6, one methodology for determining the location of target 62 requires removing portions of substrate 24 at candidate locations 122 until target portions 82–86 are bound on all sides by portions 24 at which target 62 is absent. In order to save time and resources, the logic of system 10 may be programmed to skip removal of substrate 20 at locations 122 not needed in order to locate target 62.

In accordance with an embodiment of the invention, information regarding the location of an initial target, such as target 62, is stored in memory. When a target 62 is formed on a substrate 20 in a known spatial orientation relative to additional alignment targets, then information relating to the location of one or more initial targets may be employed to direct the removal of portions 24 near subsequent targets. By employing knowledge of the spatial location of an initial target, and its orientation relative to subsequent targets, fewer portions 24 need to be removed to detect the location of each additional target. The respective locations of several targets may be collected in order to improve the estimation of the location of each additional alignment target that needs to be unveiled.

Returning to FIG. 5, after a sufficient number N of target locations have been detected, then additional portions 24 of substrate 20 are removed in a generally contiguous pattern in the vicinity of target detected portions, for example in the vicinity of target portions 82–86, to form an opening 25 (FIG. 1) to unveil the alignment target (operation 170).

Finally, after one or more alignment targets, such as target 14 in FIG. 1, are unveiled, their location is detected with a position sensor such as a CCD sensor or X-ray sensor. A part of an electrical circuit pattern (not shown) is formed in or on substrate 20 in spatial alignment to the unveiled target 14 (operation 180). The parts of an electrical circuit may be, for example, vias drilled into substrate 20 or a conductor pattern formed by suitably exposing a photoresist deposited on the surface of substrate 20. Examples of systems suitable for detecting the location of an alignment target and exposing an electrical circuit pattern in spatial alignment thereto are described in the following patent applications: U.S. Ser. No. 09/708,160 to Kantor et. al., U.S. Ser. No. 09/792,498 to Ben-Ezra et. al., and IL 142354 to Orbotech Ltd.

The system and methods described hereinabove typically are employed in the fabrication of printed boards and other suitable electrical circuits. A typical printed circuit board fabrication process includes forming on a first substrate layer a first part of an electrical circuit pattern, and an alignment pattern which is aligned to the first part of the electrical circuit pattern. The first substrate layer is then adhered to a second substrate layer to form a printed circuit board laminate in which the alignment target is embedded between said first substrate layer and the second substrate layer.

The electrical circuit pattern formed on the first substrate layer typically is a pattern of conductor members generated using conventional photolithography or other suitable conductor formation processes. A suitable alignment pattern includes two quarter circles or two diagonally disposed squares arranged to form a cross hairs.

Typically an alignment pattern needs be unveiled in order to be useful. Unveiling the alignment pattern includes forming a plurality of first openings in the laminate at a general region wherein the alignment target is expected to be located, and then following the formation of one or more first openings and sensing the location of the target. In response to sensing the location of the target, a second, larger, opening is made in the laminate to unveil the target.

Once the target is unveiled it is used by a sensor to determine the position and orientation of the substrate. The sensor may be the same sensor used to determine at which first openings the target is located or a different sensor, for example a sensor associated with pattern formation equipment. Pattern formation equipment, such as pattern exposure equipment or via formation equipment, employs the position and orientation information to produce a pattern of electrical circuit parts in the surface of the laminate in alignment to the alignment pattern. Because the alignment pattern is aligned to the electrical circuit part formed on the first substrate layer, the subsequent pattern part, being aligned to the alignment pattern, is aligned to the part of the electrical circuit pattern formed on the first substrate layer.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. A method for unveiling an alignment pattern embedded in a multi-layered printed circuit board substrate, comprising:

removing a portion of a multi-layered printed circuit board substrate at selected non-continuous locations thereof according to a first pattern;

making a sensing determination with respect to selected ones of said selected non-contiguous locations; and removing an additional portion of said multi-layered printed circuit board at least at one additional location discrete from said selected non-continuous locations according to a second pattern of contiguous locations thereby to form an unveiling opening that is larger than ones of said non-contiguous locations, said at least one additional location being selected at least partly in response to said sensing determination.

2. The method claimed in claim 1 and wherein said removing comprises removing a portion of said multi-layered printed circuit board using a micro-machining device comprising a laser.

3. The method claimed in claim 1 and wherein said removing comprises removing part of a single layer of said multi-layered printed circuit board.

4. The method claimed in claim 1 and wherein said removing comprises removing part of at least two layers of said multi-layered printed circuit board.

5. The method claimed in claim 1 and wherein said sensing determination is made based on an optical sensor output.

6. The method claimed in claim 5 and wherein said sensing determination is made based on an output of an optical sensor comprising a photodiode.

7. The method claimed in claim 5 and wherein said sensing determination is made based on an output of an optical sensor comprising a CCD sensor.

8. The method claimed in claim 1 and wherein said sensing determination is based on an output of an acoustic sensor.

9. The method claimed in claim 1 and wherein said sensing determination is based on an output of an X-ray sensor.

* * * * *

UNITED STATES PATENT AND TRADEMARK OFFICE
CERTIFICATE OF CORRECTION

PATENT NO. : 6,911,620 B2  Page 1 of 1
APPLICATION NO. : 10/214755
DATED : June 28, 2005
INVENTOR(S) : Eliezer Lipman, Yehiam Prior and Zvi Kotler

It is certified that error appears in the above-identified patent and that said Letters Patent is hereby corrected as shown below:

IN THE CLAIMS:

Column 8, claim 1, line 25, delete "non-continuous", insert --non-contiguous--.
line 31, delete "non-continuous", insert --non-contiguous--.

Signed and Sealed this

Fifth Day of January, 2010

David J. Kappos
*Director of the United States Patent and Trademark Office*